(12) United States Patent
Chin

(10) Patent No.: US 6,956,243 B1
(45) Date of Patent: Oct. 18, 2005

(54) LIGHT EMITTING DIODE

(75) Inventor: Yuan-Cheng Chin, Hsintien (TW)

(73) Assignee: Unity Opto Technology Co., LTD, Taipei Hsien (TW)

( * ) Notice: Subject to any disclaimer, the term of this patent is extended or adjusted under 35 U.S.C. 154(b) by 0 days.

(21) Appl. No.: 10/896,909

(22) Filed: Jul. 23, 2004

(51) Int. Cl.$^7$ .......................... H01L 27/15; H01L 31/12
(52) U.S. Cl. .......................................... 257/79; 257/98
(58) Field of Search ........................... 257/79, 98–100, 257/676, 680, 794

(56) References Cited

U.S. PATENT DOCUMENTS

| | | | |
|---|---|---|---|
| 6,614,103 B1 * | 9/2003 | Durocher et al. | 257/678 |
| 6,653,661 B2 * | 11/2003 | Okazaki | 257/98 |
| 6,756,731 B1 * | 6/2004 | Sano | 313/499 |

* cited by examiner

Primary Examiner—Phat X. Cao
Assistant Examiner—Theresa T. Doan
(74) Attorney, Agent, or Firm—Troxell Law Office, PLLC

(57) ABSTRACT

A light emitting diode (LED) includes a base, a reflector cup, a plurality of LED dices, a plastic layer, and a glass lens. External terminals are mounted in the base. The reflector cup is received and fixed in the base and forms a recess in which the dices are received and fixed. The dices are connected by conductors to the external terminals. The plastic layer is filled in the base to seal the reflector cup, the dices, the conductors, and portions of the external terminals. A bottom of the reflector cup is exposed outside the plastic layer and the external terminals extend beyond the plastic layer. The lens is made of glass containing fluorescent powders and is positioned on the plastic layer at a position corresponding to the dices. The glass lens that has a high melting point offers an excellent heat resistance and thus enhances the life span and reliability of the LED.

2 Claims, 2 Drawing Sheets

LIGHT EMITTING DIODE

FIELD OF THE INVENTION

The present invention generally relates to a light emitting diode (LED), and in particular to a LED featuring good heat resistance by providing a glass lens containing fluorescent powders therein at a location corresponding to an LED dice to replace a conventional lens made of plastics, such as epoxy resin, PC, PMMA, PEI, PC/PMMA, and COC, which has poor heat resistance, whereby the overall service life and operation reliability of an LED based lighting device can be extended and a lighting device with intense light can be obtained with such a with LED structure.

BACKGROUND OF THE INVENTION

A conventional light emitting diode (LED), as shown in FIG. 1 of the attached drawings, comprises two lead frames 71, 72 packaged in transparent plastics 7. One of the lead frames, for example lead frame 71, has a top end defining a recess 711 in which an LED dice 73 is accommodated. A gold wire 74 connects the dice 73 to the other lead frame 72. A fluorescent layer 8 is also received in the recess 711 to complete the structure of the LED. The fluorescent layer 8 allows the LED to emit color light. Although the conventional structure LED realizes the emission of color light, the material used to package the LED, such as the transparent plastics 7 and the fluorescent layer 8, is not capable to endure high temperature and the service life of the LED is shortened due to the poor heat resistance thereof.

SUMMARY OF THE INVENTION

Thus, a primary objective of the present invention is to provide a light emitting diode (LED) comprising a reflector cup accommodating LED dices that are properly wired and a glass lens containing fluorescent powders located at a position corresponding to the LED dices, which glass lens offers excellent heat resistance and thus enhanced life span and reliability of the LED.

To achieve the above objective, in accordance with the present invention, a light emitting diode (LED) is provided, comprising a base, a reflector cup, a plurality of LED dices, a plastic layer, and a glass lens. External terminals are mounted in the base. The reflector cup is received and fixed in the base and forms a recess in which the dices are received and fixed. The dices are connected by conductors to the external terminals. The plastic layer is filled in the base to seal the reflector cup, the dices, the conductors, and portions of the external terminals. A bottom of the reflector cup is exposed outside the plastic layer and the external terminals extend beyond the plastic layer. The lens is made of glass containing fluorescent powders and is positioned on the plastic layer so as to correspond in position to the LED dices. This offers an excellent heat resistance and thus enhances the life span and reliability of the LED.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENT

Figure 1:
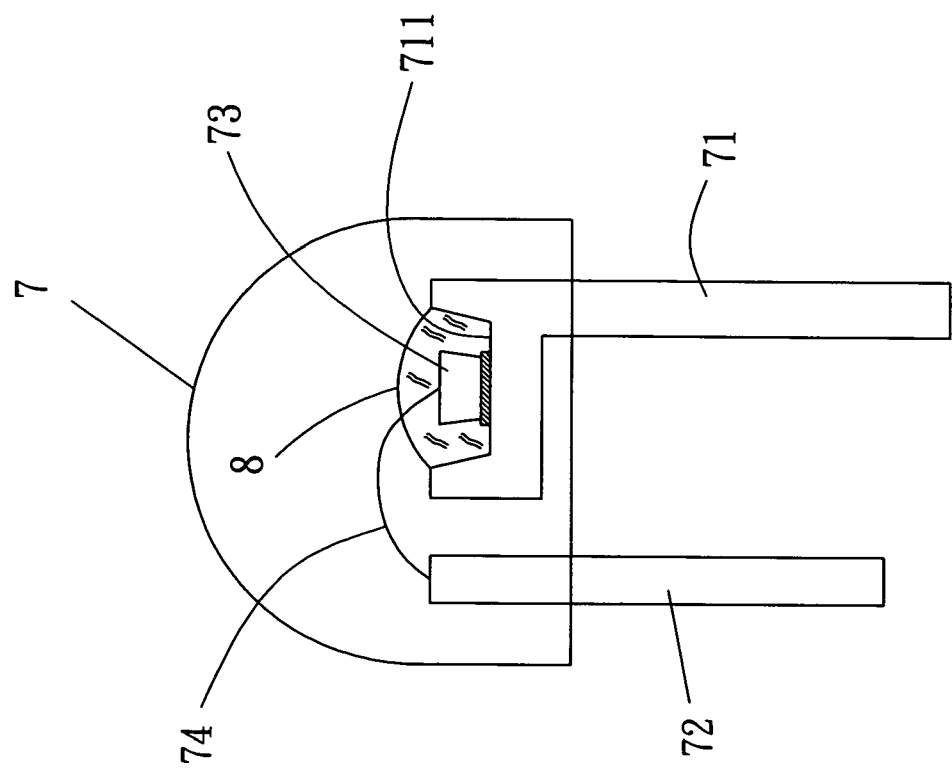
FIG. 1 is a schematic side view of a conventional light emitting diode.
Figure 2:
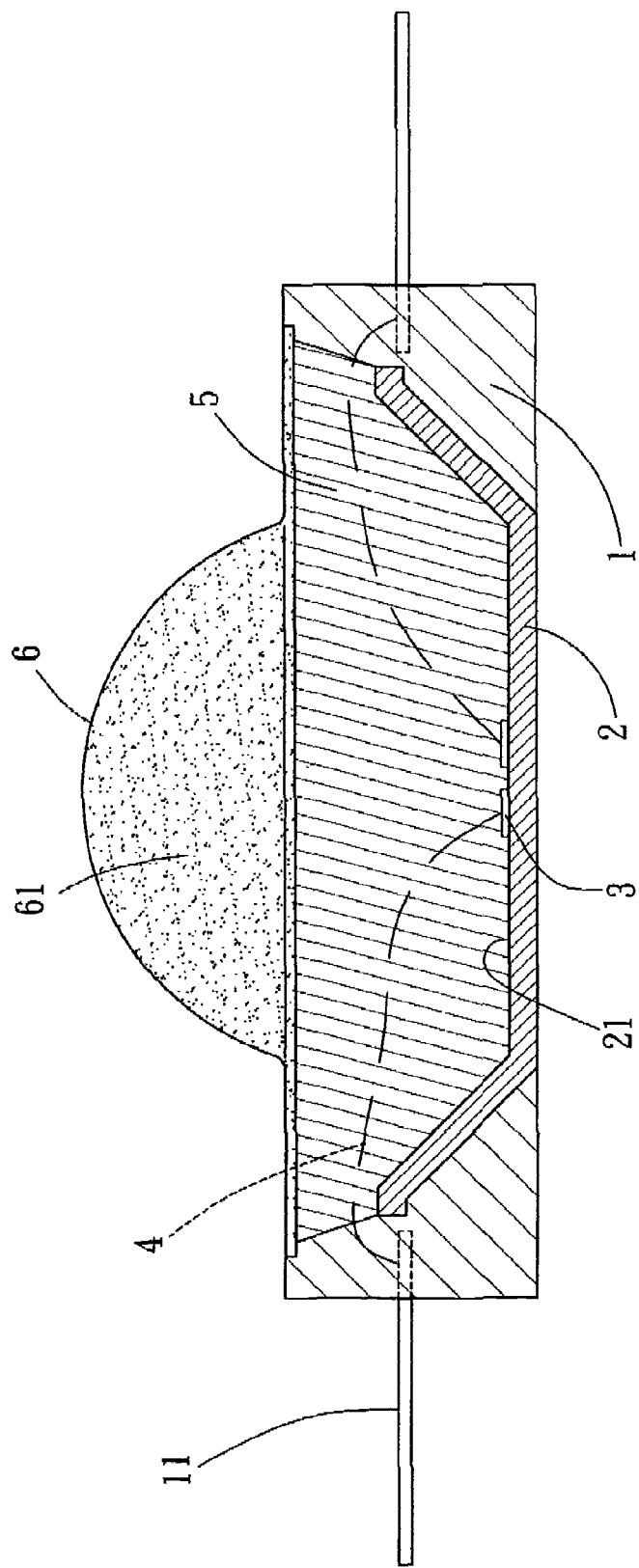
FIG. 2 is a cross-sectional view of a light emitting diode constructed in accordance with the present invention.

With reference to the drawings and in particular to FIG. 2, a light emitting diode (LED) constructed in accordance with the present invention comprises a base 1 from which two terminals 11 extend in opposite directions for connection with an external power source (not shown).

A reflector cup 2, which is made of for example ceramics, plastics, and metals, is received and fixed in the base 1. The reflector cup 2 defines a recess 21 in which a plurality of LED dices 3 is received and fixed. Conductors 4 connect the dices 3 to the terminals 11 of the base 1.

A plastic layer 5 is filled in the base 1 to seal the reflector cup 2, the dices 3, the conductors 4, and portions of the terminals 11. The plastic layer 5 is formed in such a way to allow a bottom of the reflector cup 2 exposed outside the plastics 5 and the terminals 11 extending beyond the plastics 5.

A lens 6 made of glass is positioned on the plastic layer 5 at a location corresponding to the dices 3 and closes the reflector cup 2 in such a way that an outer circumference of the lens 6 engages and is supported by a top flange of the base 1. The lens 6 is made of glass containing fluorescent powders 61.

The LED of the present invention comprises a reflector cup 2, electrically connected dices 3, conductors 4, and terminals 11 that are all packaged by a base 1 and plastics 5 and featuring a glass lens 6 containing fluorescent powders 61 therein mounted to the top side of the reflector cup 2 at a position corresponding to the dices 3. The glass lens 6, made of glass having high melting point, offers excellent heat resistance and thus enhances the life span and reliability of the LED.

Although the present invention has been described with reference to the preferred embodiment thereof, it is apparent to those skilled in the art that a variety of modifications and changes may be made without departing from the scope of the present invention which is intended to be defined by the appended claims.

What is claimed is:
1. A light emitting diode comprising:
   a base in which external terminals are mounted;
   a reflector cup received and fixed in the base, the reflector cup defining a recess;
   dices received and fixed in the recess of the reflector cup and connected by conductors to the external terminals;
   a plastic layer filled in the base to seal the reflector cup, the dices, the conductors, and portions of the external terminals, a bottom of the reflector cup being exposed outside the plastic layer, the external terminals extending beyond the plastic layer; and
   a lens made of glass containing fluorescent powders, the lens being positioned on the plastic layer at a position corresponding to the dices.
2. The light emitting diode as claimed in claim 1, wherein the lens has an outer circumference engaging and supported by a to flange of the base.

* * * * *